US012457819B2

(12) United States Patent
Park

(10) Patent No.: US 12,457,819 B2
(45) Date of Patent: Oct. 28, 2025

(54) IMAGE SENSOR

(71) Applicant: Samsung Electronics Co., Ltd., Suwon-si (KR)

(72) Inventor: Miseon Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 313 days.

(21) Appl. No.: 18/048,918

(22) Filed: Oct. 24, 2022

(65) Prior Publication Data

US 2023/0299107 A1 Sep. 21, 2023

(30) Foreign Application Priority Data

Mar. 18, 2022 (KR) .................. 10-2022-0033829

(51) Int. Cl.
*H01L 27/146* (2006.01)
*H10F 39/00* (2025.01)
*H10F 39/18* (2025.01)

(52) U.S. Cl.
CPC ......... *H10F 39/807* (2025.01); *H10F 39/182* (2025.01); *H10F 39/8063* (2025.01); *H10F 39/811* (2025.01)

(58) Field of Classification Search
CPC .... H10D 62/117; H10D 62/10; H10D 18/211; H10F 19/75; H10F 10/161; H10F 10/163; H10F 39/807; H10F 39/00; H10F 39/182; H10F 39/18; H10F 39/811; H10F 39/1865; H10F 39/8063; H10F 39/802; H10F 39/80373; A61K 40/4225; A61K 40/42
See application file for complete search history.

(56) References Cited

U.S. PATENT DOCUMENTS 7,115,974 B2 10/2006 Wu et al.
8,445,950 B2 5/2013 Iida et al.
9,420,209 B2 8/2016 Ahn et al.
(Continued)

FOREIGN PATENT DOCUMENTS

KR 10-2019-0041830 A 4/2019
KR 10-2020-0087909 A 7/2020

OTHER PUBLICATIONS

Office Action for counterpart Korean Application No. 10-2022-0033829 dated Sep. 12, 2025.

*Primary Examiner* — Nikolay K Yushin
(74) *Attorney, Agent, or Firm* — Harness, Dickey & Pierce, P.L.C.

(57) ABSTRACT

An image sensor includes a pixel division structure including a core and a lateral pattern structure on a sidewall of the core, the pixel division structure extending through a substrate in a vertical direction perpendicular to an upper surface of the substrate, the pixel division structure defining unit pixel regions including unit pixels. The image sensor includes a light sensing element in each of the unit pixel regions, a planarization layer on the substrate, a color filter array layer on the planarization layer, the color filter array layer including color filters, and a microlens on the color filter array layer. The lateral pattern structure includes a second lateral pattern on the sidewall of the core and a first lateral pattern on an outer sidewall of the second lateral pattern, the first lateral pattern includes silicon oxide, and the second lateral pattern includes silicon nitride containing carbon.

20 Claims, 21 Drawing Sheets

(56) References Cited

U.S. PATENT DOCUMENTS

| | | | |
|---|---|---|---|
| 9,620,548 B1 | 4/2017 | Wang et al. | |
| 9,887,235 B2 | 2/2018 | Cheng et al. | |
| 2013/0189841 A1* | 7/2013 | Balseanu | H01L 21/02126 438/692 |
| 2014/0374868 A1 | 12/2014 | Lee et al. | |
| 2017/0250211 A1 | 8/2017 | Chang et al. | |

* cited by examiner

IMAGE SENSOR

CROSS-REFERENCE TO RELATED APPLICATION

This application claims priority under 35 USC § 119 to Korean Patent Application No. 10-2022-0033829, filed on Mar. 18, 2022 in the Korean Intellectual Property Office (KIPO), the contents of which are herein incorporated by reference in their entirety.

FIELD

Some example embodiments relate to an image sensor. More particularly, some example embodiments relate to an image sensor including a pixel division structure.

BACKGROUND

In an image sensor including a pixel division structure, electron flow may be generated at a boundary between the pixel division structure and a light sensing element to cause a dark current, and a negative bias may be applied to a core included in the pixel division structure so that the electron flow may be captured by an impurity region to reduce the dark current. Thus, the core of the pixel division structure may include polysilicon.

A lateral pattern surrounding the core may include a material for capturing electrons, and a proper material for the lateral pattern has been studied.

SUMMARY

Some example embodiments provide an image sensor having improved characteristics.

According to some example embodiments, an image sensor includes a pixel division structure including a core and a lateral pattern structure on a sidewall of the core, the pixel division structure extending through a substrate in a vertical direction, the vertical direction perpendicular to an upper surface of the substrate, the pixel division structure defining unit pixel regions, and the unit pixel regions including unit pixels. The image sensor includes a light sensing element in each of the unit pixel regions, a planarization layer on the substrate, a color filter array layer on the planarization layer, the color filter array layer including color filters, and a microlens on the color filter array layer. The lateral pattern structure includes a second lateral pattern on the sidewall of the core and a first lateral pattern on an outer sidewall of the second lateral pattern, the first lateral pattern includes silicon oxide, and the second lateral pattern includes silicon nitride containing carbon.

According to some example embodiments, an image sensor includes a pixel division structure extending through a substrate in a vertical direction, the vertical direction substantially perpendicular to an upper surface of the substrate, the pixel division structure including a core extending in the vertical direction and a lateral pattern structure on a sidewall of the core, the pixel division structure defining unit pixel regions, the unit pixel regions including unit pixels. The image sensor includes a light sensing element in each of the unit pixel regions, a planarization layer on the substrate, a color filter array layer on the planarization layer, the color filter array layer including color filters, and a microlens on the color filter array layer. The lateral pattern structure includes a second lateral pattern on the sidewall of the core and a first lateral pattern on an outer sidewall of the second lateral pattern, the core includes polysilicon doped with p-type or n-type impurities, the first lateral pattern includes silicon oxide, the second lateral pattern includes silicon oxide, and the second lateral pattern includes silicon carbonitride (SiCN), silicon oxycarbonitride (SiOCN), or silicon borocarbonitride (SiBCN).

According to some example embodiments, an image sensor includes first substrate defining a first region, a second region, a third region and a fourth region inside the first substrate and a space under and over the first substrate, the second region surrounding the first region, the third region surrounding the second region, and the fourth region surrounding the third region. The image sensor includes a first insulating interlayer on the first substrate, the first insulating interlayer containing first wirings in the third region, a second insulating interlayer on the first insulating interlayer, the second insulating interlayer containing second wirings in the third region, a second substrate on the second insulating interlayer, and a pixel division structure in the second substrate in the first and second regions, the pixel division structure including a core and a lateral pattern structure on a sidewall of the core, the pixel division structure defining unit pixel regions, the unit pixel regions including unit pixels. The image sensor includes a light sensing element in each of the unit pixel regions of the second substrate, a transfer gate (TG) extending through a lower portion of the second substrate, the TG contacting the light sensing element, a floating diffusion (FD) region at a lower portion of the second substrate adjacent to the TG, a lower planarization layer on the second substrate, a color filter array layer on the lower planarization layer, the color filter array layer including color filters, an interference blocking structure between the color filters, and a microlens on the color filter array layer. The lateral pattern structure includes a second lateral pattern on the sidewall of the core and a first lateral pattern on an outer sidewall of the second lateral pattern, the first lateral pattern includes silicon oxide, and the second lateral pattern includes silicon nitride containing carbon.

In the image sensor in accordance with some example embodiments, no void or seam may be formed in the lateral pattern included in the pixel division structure, and thus the capture rate of electrons may increase to reduce the dark current.

DETAILED DESCRIPTION

Image sensors and methods of manufacturing the image sensors in accordance with SOME example embodiments will be more clearly understood from the following detailed description taken in conjunction with the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

First to four regions I, II, III and IV may refer to only an inside of a reference substrate, a first substrate and/or a second substrate. Alternatively, the first to four regions I, II, III and IV may also refer to spaces over and under the reference substrate, the first substrate and/or the second substrate.

A direction substantially parallel to the reference substrate or the first substrate and/or the second substrate may be referred to as a horizontal direction, and a direction substantially perpendicular to the surface of the reference substrate or the first substrate and/or the second substrate may be referred to as a vertical direction. In the specifications, up vs. down, on and over vs. beneath and under, upper surface vs. lower surface, and upper portion vs. lower portion are relative conceptions so as to describe opposite sides in the vertical direction, and each wording may have opposite meanings according to the specific parts to be explained in the specifications.

Figure 1:
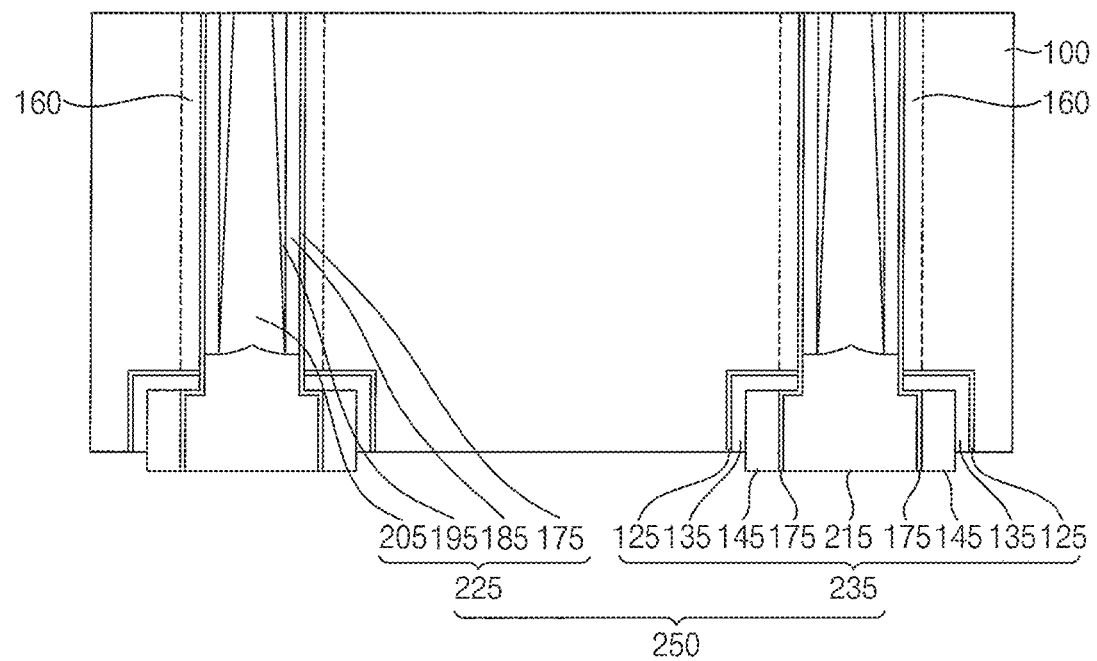
FIG. 1 is a cross-sectional view illustrating a pixel division structure included in an image sensor in accordance with some example embodiments.

FIG. 1 is a cross-sectional view illustrating a pixel division structure included in an image sensor in accordance with some example embodiments.

Referring to FIG. 1, a pixel division structure 250 may extend through a substrate 100 in the vertical direction, and may have a lattice shape in a plan view.

In some example embodiments, the substrate 100 may include silicon, germanium, silicon-germanium, or a III-V group compound semiconductor, such as GaP, GaAs, or GaSb, but example embodiments are not limited thereto. In some example embodiments, a p-type well doped with p-type impurities may be formed partially or entirely in the substrate 100.

Unit pixel regions in which unit pixels are formed, respectively, may be defined by the pixel division structure 250 in the substrate 100. In some example embodiments, the unit pixels may be arranged in the horizontal direction to form a pixel array.

In some example embodiments, the pixel division structure 250 may include a first filling pattern structure 235 and a second filling pattern structure 225 stacked in the vertical direction. The second filling pattern structure 225 may include a core extending in the vertical direction and a first lateral pattern structure covering a sidewall of the core.

In some example embodiments, the core may include second and third filling patterns 195 and 205, and the first lateral pattern structure may include an upper portion of the first lateral pattern 175 and a second lateral pattern 185.

In some example embodiments, the second filling pattern 195 may include polysilicon doped with p-type impurities, e.g., boron, or n-type impurities, e.g., phosphorous. The third filling pattern 205 may include undoped polysilicon, or polysilicon doped with impurities substantially the same as those included in the second filling pattern 195.

In some example embodiments, the third filling pattern 205 may have a width gradually decreasing from a bottom toward a top thereof. In some example embodiments, a portion of the second filling pattern 195 adjacent to the third filling pattern 205 may have a width gradually increasing from a bottom toward a top thereof.

In some example embodiments, a lower surface of a portion of the core including the second and third filling patterns 195 and 205 may have a concave shape.

The second lateral pattern 185 may cover a sidewall of the core, and an upper portion of the first lateral pattern 175 may cover an outer sidewall of the second lateral pattern 185.

The first lateral pattern 175 may include an oxide, e.g., silicon oxide.

In some example embodiments, the second lateral pattern 185 may include a material having an etch rate lower than that of silicon nitride ($Si_3N_4$) with respect to phosphoric acid ($H_3PO_4$), e.g., silicon nitride containing carbon.

In some example embodiments, the second lateral pattern 185 may include, e.g., silicon carbonitride (SiCN). Alternatively, the second lateral pattern 185 may include, e.g., silicon oxycarbonitride (SiOCN), silicon borocarbonitride (SiBCN), etc., but example embodiments are not limited thereto.

In some example embodiments, carbon included in the second lateral pattern 185 may have an atomic percentage in a range of about 1 at % to about 20 at %.

The first filling pattern structure 235 may include a fourth filling pattern 215 under the core and the second lateral pattern 185, a lower portion of the first lateral pattern 175 on a sidewall of the fourth filling pattern 215, a first filling pattern 145 covering an outer sidewall of the lower portion of the first lateral pattern 175, and first and second pads 125 and 135 covering an outer sidewall and an upper surface of the first filling pattern 145.

In some example embodiments, the fourth filling pattern 215 may have an upper portion having a relatively small width and a lower portion having a relatively large width. The fourth filling pattern 215 may include an oxide, e.g., silicon oxide.

The upper portion of the first lateral pattern 175 may be included in the second filling pattern structure 225, and the lower portion of the first lateral pattern 175 may be included in the first filling pattern structure 235. The lower and upper portions of the first lateral pattern 175 may be connected to each other and integrally formed. The lower portion of the first lateral pattern 175 may cover a sidewall of the upper portion of the fourth filling pattern 215 and an upper surface and a sidewall of the lower portion of the fourth filling pattern 215.

The first filling pattern 145 may cover an outer sidewall of a portion of the first lateral pattern 175 on the sidewall of the lower portion of the fourth filling pattern 215. The first filling pattern 145 may include an oxide, e.g., silicon oxide.

The second pad 135 may cover the sidewall and the upper surface of the first filling pattern 145, while may not cover a sidewall of the lower portion of the first filling pattern 145. The first pad 125 may cover an outer sidewall and an upper surface of the second pad 135. The first pad 125 may include an oxide, e.g., silicon oxide, and the second pad 135 may include a nitride, e.g., silicon nitride.

In some example embodiments, a width of the first filling pattern structure 235 may be greater than a width of the second filling pattern structure 225.

An impurity region 160 may be formed at a portion of the substrate 100 adjacent to the pixel division structure 250, and may include p-type impurities, e.g., boron.

In the image sensor including the pixel division structure 250, electrons may flow at a boundary between the pixel division structure 250 and a light sensing element to generate a dark current, and a negative bias may be applied to the core included in the pixel division structure 250 so that the flow of electrons may be captured by the impurity region 160 to decrease the dark current.

Thus, the core included in the pixel division structure 250 may include doped or undoped polysilicon, and the first lateral pattern structure surrounding the core may have the second lateral pattern 185 including silicon nitride, which may have a high dielectric constant for capturing electrons.

As illustrated below with reference to FIG. 7, the second lateral pattern 185 may be formed by removing an upper portion of the second lateral layer 180 through a wet etching process using phosphoric acid. Silicon nitride may have a high etch rate with respect to phosphoric acid, and thus a lower portion of the second lateral layer 180 as well as the upper portion of the second lateral layer 180 may be removed during the wet etching process, so that a void or seam may be formed in the second lateral pattern 185. In some example embodiments, the capture of the electrons due to the dark current may not be performed well.

However, in some example embodiments, the second lateral layer 180 may include a material having an etch rate lower than that of silicon nitride with respect to phosphoric acid, e.g., silicon nitride containing carbon, and thus the second lateral layer 180 may not be excessively etched during the wet etching process. As a result, no void or seam may be formed in the second lateral pattern 185, and thus the rate of capture of the electrons may increase to reduce the dark current.

Figure 9:
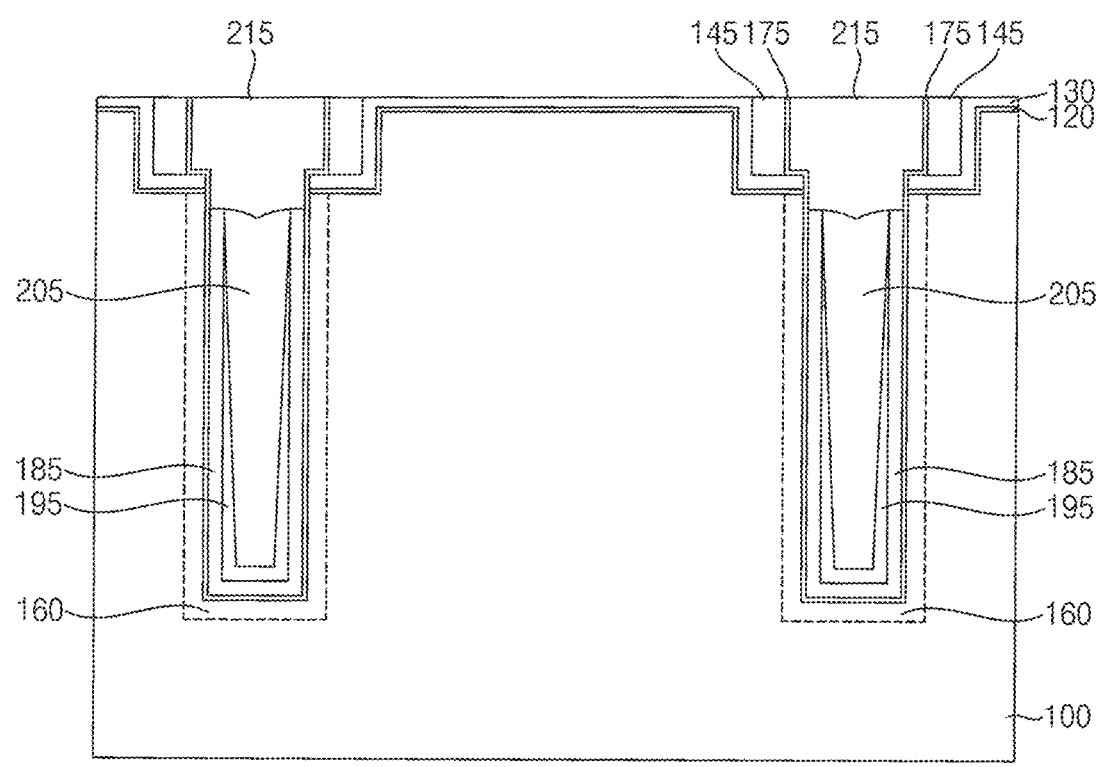
Figure 10:
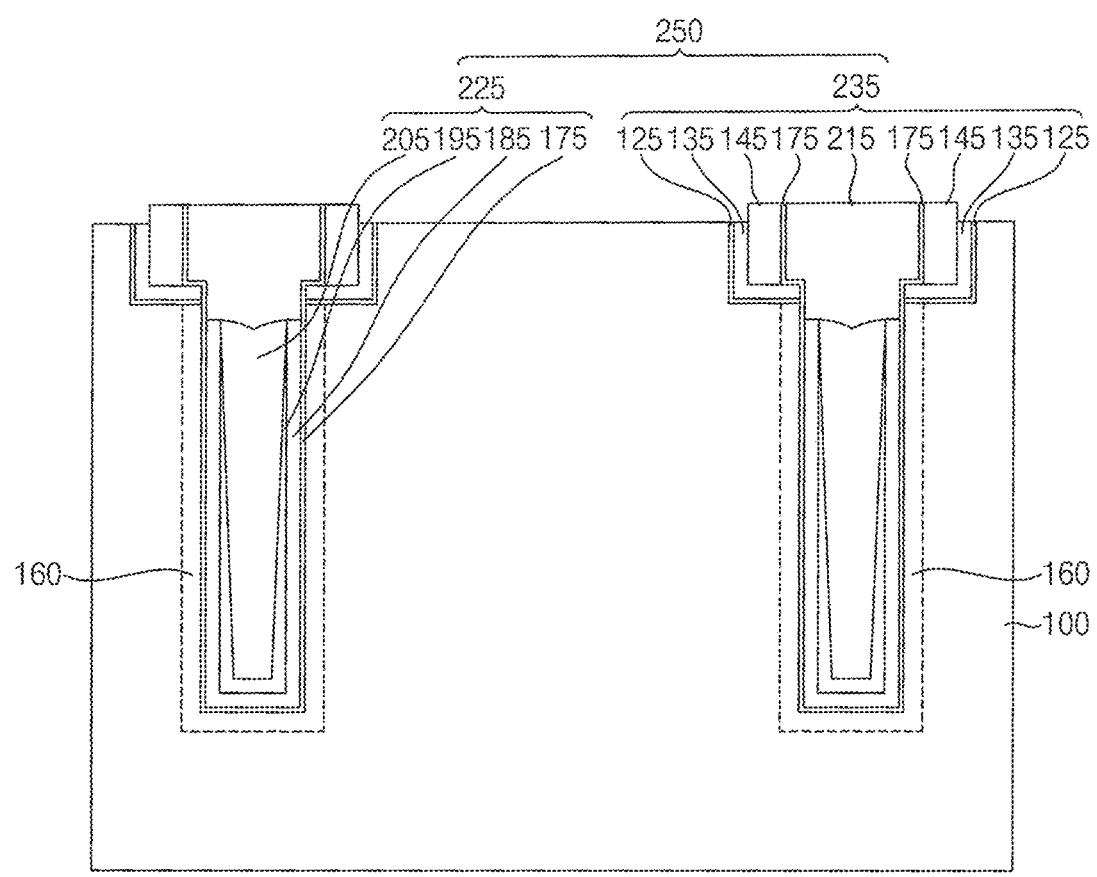
Figure 11:
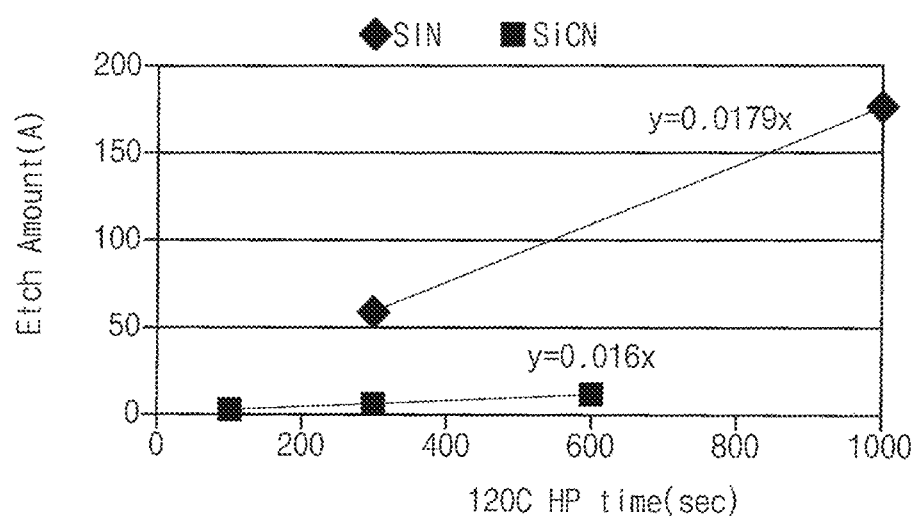
FIG. 11 is a graph illustrating example etch rates of silicon nitride (SiN) and silicon carbonitride (SiCN) with respect to phosphoric acid.

FIGS. 2 to 10 are cross-sectional views illustrating a method of forming a pixel division structure in accordance with some example embodiments, and FIG. 11 is a graph illustrating etch rates of silicon nitride (SiN) and silicon carbonitride (SiCN) with respect to phosphoric acid.

Figure 2:
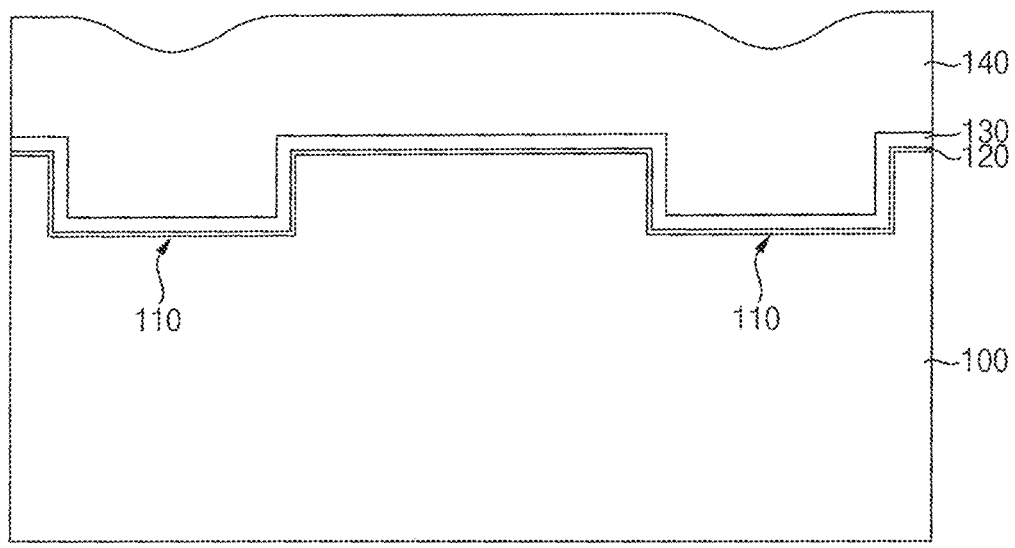
FIGS. 2, 3, 4, 5, 6, 7, 8, 9 and 10 are cross-sectional views illustrating a method of forming a pixel division structure in accordance with some example embodiments.

Referring to FIG. 2, an upper portion of a substrate 100 may be removed to form a first trench 110, and a first pad layer 120, a second pad layer 130 and a first filling layer 140 may be sequentially stacked on the substrate 100 having the first trench 110 thereon.

In some example embodiments, the first trench 110 may have a lattice pattern in a plan view.

Figure 3:
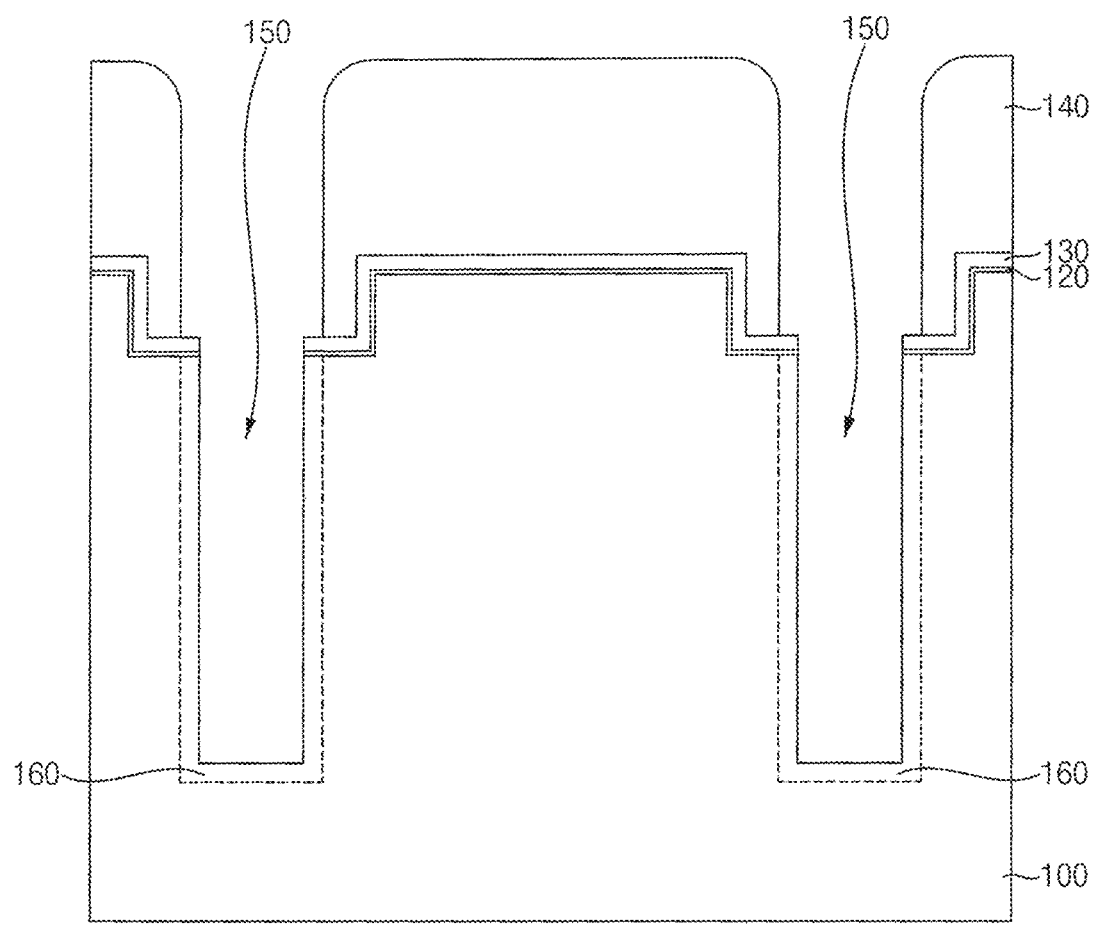

Referring to FIG. 3, the first filling layer 140, the second pad layer 130, the first pad layer 120 and the substrate 100 may be sequentially removed by an etching process to form a second trench 150.

The etching process may be, e.g., a dry etching process, and thus may be performed with an etching mask on the first filling layer 140. Due to the difference between etching rates of the first filling layer 140 and the second pad layer 130, the second trench 150 may be formed to have a width in the first and second pad layers 120 and 130 less than a width in the first filling layer 140.

Hereinafter, in the second trench 150, a portion extending through a portion of the substrate 100 and the first and second pad layers 120 and 130 may be referred to as a lower portion, and a portion extending through the first filling layer 140 may be referred to as an upper portion.

P-type impurities, e.g., boron may be doped into a portion of the substrate 100 adjacent to the second trench 150 by an ion implantation process to form an impurity region 160.

Figure 4:
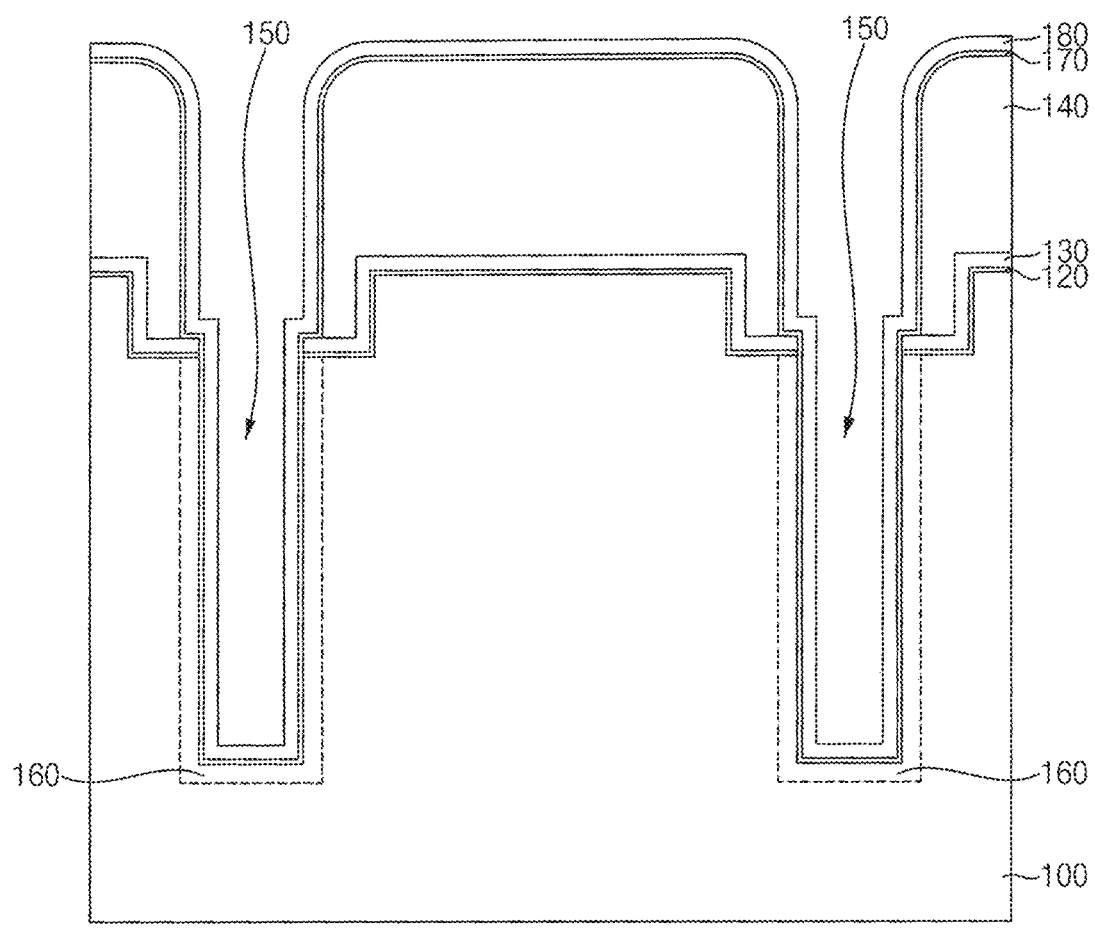

Referring to FIG. 4, a lateral layer structure may be formed on an inner wall of the second trench 150 and an upper surface of the first filling layer 140.

In some example embodiments, the lateral layer structure may include first and second lateral layers 170 and 180 sequentially stacked and including different materials. The first lateral layer 170 may include an oxide, e.g., silicon oxide.

In some example embodiments, the second lateral layer 180 may include a material having an etch rate lower than that of silicon nitride with respect to phosphoric acid, e.g., silicon nitride containing carbon.

In example embodiments, the second lateral layer 180 may be formed by an atomic layer deposition (ALD) process using a silicon source gas, e.g., $Si_2Cl_6$, a carbon source gas, e.g., $C_3H_6$, and a nitrogen source gas, e.g., $NH_3$, at a temperature of about 600° C. to about 780° C., but example embodiments are not limited thereto. Thus, the second lateral layer 180 may include silicon carbonitride (SiCN).

Alternatively, the second lateral layer 180 may include silicon oxycarbonitride (SiOCN), silicon borocarbonitride (SiBCN), etc., but example embodiments are not limited thereto.

In some example embodiments, carbon included in the second lateral layer 180 may have an atomic percentage in a range of about 1 at % to about 20 at %.

Figure 5:
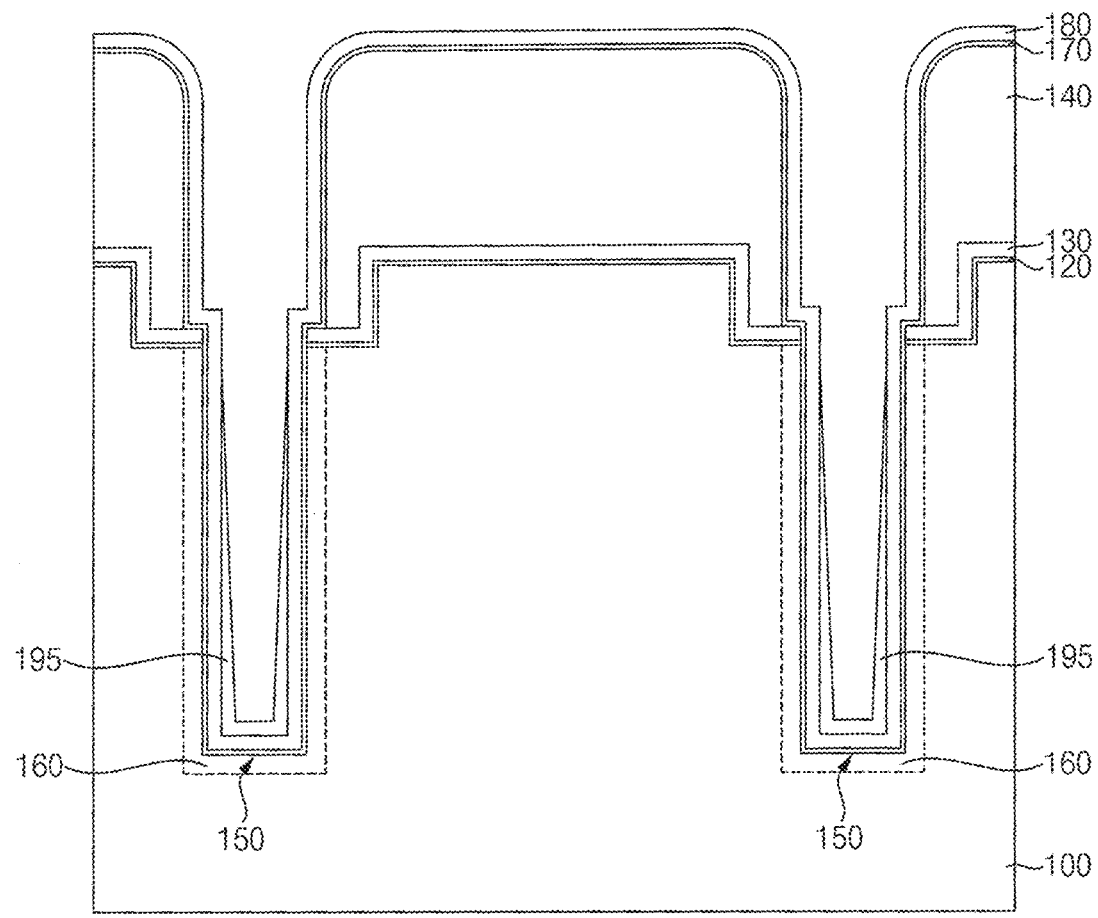

Referring to FIG. 5, a second filling layer may be formed on the lateral layer structure, and the second filling layer may not entirely fill a remaining portion of the second trench 150, but may be formed on a sidewall and a bottom of the second trench 150.

In some example embodiments, the second filling layer may include polysilicon doped with p-type impurities, e.g., boron or n-type impurities, e.g., phosphorus, and thus may include a conductive material.

In an example embodiment, the second filling layer may be formed by a low-pressure chemical vapor deposition (LPCVD) process or a plasma enhanced chemical vapor deposition (PECVD) process using a silicon source gas, e.g., silane ($SiH_4$) gas and a boron source gas, e.g., diborane ($B_2H_6$) gas or a phosphorus source gas, e.g., phosphine ($PH_3$) gas, but example embodiments are not limited thereto.

Alternatively, the second filling layer may be formed to include undoped polysilicon, and boron or phosphorus may be doped into the second filling layer by, e.g., an ion implantation process, a plasma doping process, a gas phase doping process, etc., so that the second filling layer may include polysilicon doped with boron or phosphorus.

An etching process may be performed on the second filling layer so that a portion of the second filling layer at the upper portion of the second trench 150 may be removed to form a second filling pattern 195.

In some example embodiments, the etching process may be performed using an etching gas including chlorine ($Cl_2$) gas, and may be an anisotropic etching process. Thus, the portion of the second filling layer at the upper portion of the second trench 150 may be entirely removed, and the portion of the second filling layer at the lower portion of the second trench 150 may remain as the second filling pattern 195, which may have a tapered shape in which a width gradually increases from a top toward a bottom thereof. Thus, a remaining portion of the lower portion of the second trench 150 that is partially filled with the second filling pattern 195 may have a width gradually decreasing from a top toward a bottom thereof.

In some example embodiments, the deposition process for forming the second filling layer and the etching process of the second filling layer may be performed in-situ in the same chamber, or ex-situ in different chambers.

In an example embodiment, an uppermost surface of the second filling pattern 195 remaining in the second trench 150 may be lower than a lower surface of the first pad layer 120, however, example embodiments are not limited thereto. That is, the uppermost surface of the second filling pattern 195 in the second trench 150 may be lower than or substantially coplanar with a bottom of the upper portion of the second trench 150, that is, an upper surface of the second pad layer 130 in the first trench 110.

Figure 6:
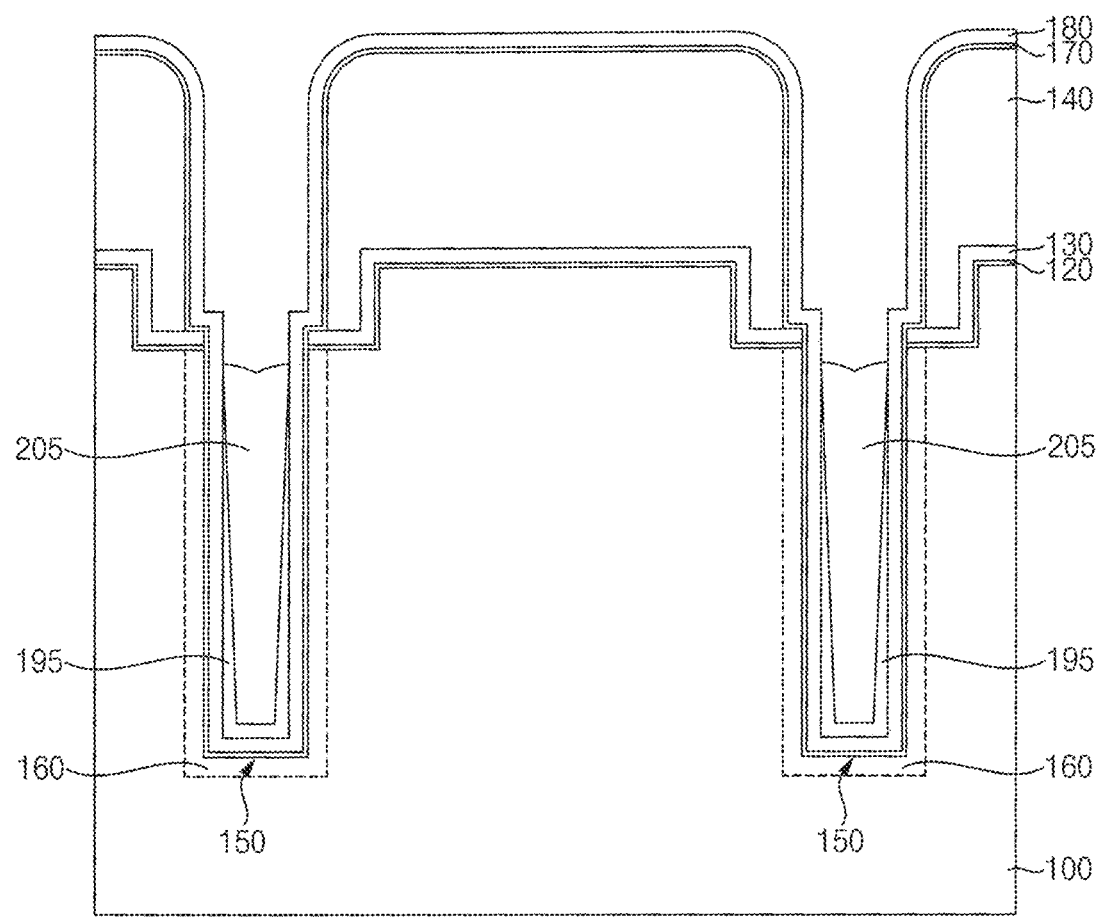

Referring to FIG. 6, a third filling layer may be formed on the second filling pattern 195 to fill the second trench 150, and may be etched until an upper surface of the portion of the second filling pattern 195 in the second trench 150 is exposed.

Thus, a third filling pattern 205 may be formed on the second filling pattern 195 at a lower portion of the second trench 150. The third filling pattern 205 may have a concave upper surface. In an example embodiment, a cross-section of the third filling pattern 205 in the vertical direction may have a V-shape.

The third filling layer may be formed by a deposition process, e.g., an LPCVD process, a PECVD process, etc. As illustrated above, the remaining portion of the lower portion of the second trench 150 may have the width gradually decreasing from a top toward a bottom thereof, and thus no void or seam may be formed when the third filling layer is deposited at the lower portion of the second trench 150.

In some example embodiments, the third filling pattern 205 may include undoped polysilicon. In other example embodiments, the third filling pattern 205 may include polysilicon doped with n-type impurities.

The second and third filling patterns 195 and 205 at the lower portion of the second trench 150 may form a core.

Figure 7:
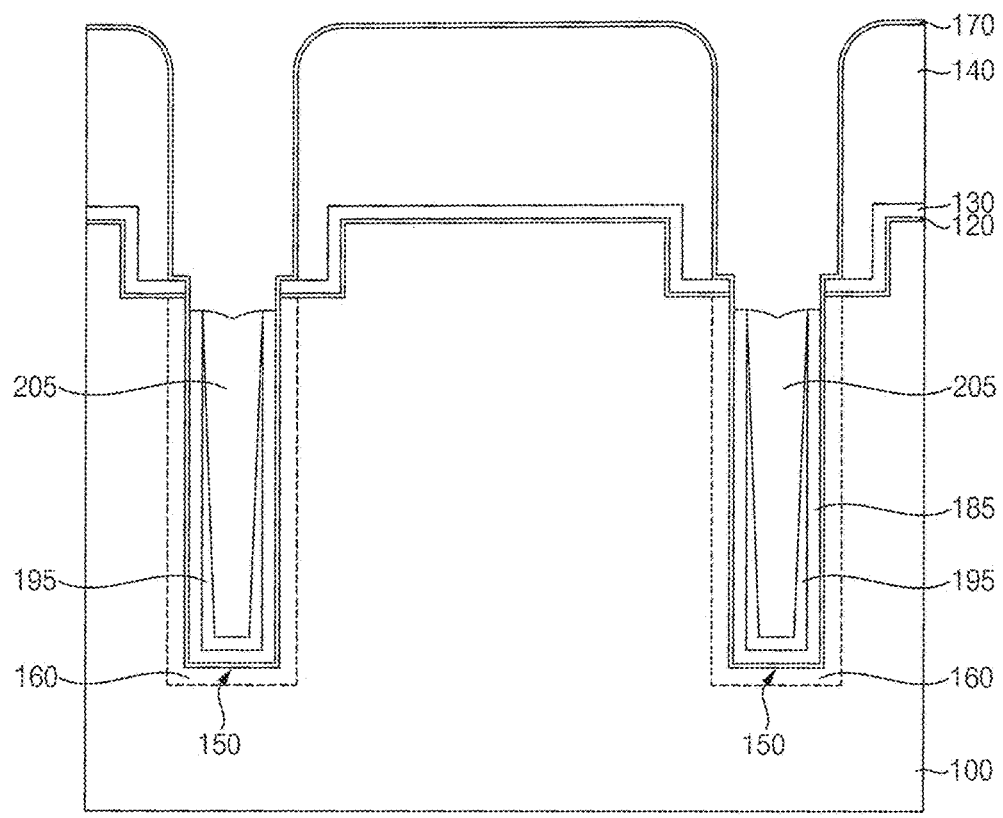

Referring to FIG. 7, a portion of the second lateral layer 180 at a height higher than an upper surface of the core, that is, an upper portion of the second lateral layer 180 may be removed so that a second lateral pattern 185 may remain at a lower portion of the second trench 150.

In some example embodiments, the upper portion of the second lateral layer 180 may be removed by a wet etching process using, e.g., phosphoric acid as an etchant. As the upper portion of the second lateral layer 180 is removed, a surface of an upper portion of the first lateral layer 170 may be exposed.

As illustrated above, the second lateral layer 180 may include the material having a low etch rate with respect to phosphoric acid, e.g., silicon nitride containing carbon.

FIG. 11 shows etch rates of silicon nitride (SiN) and silicon carbonitride (SiCN) with respect to phosphoric acid ($H_3PO_4$). An atomic percent of carbon in silicon carbontride is about 6.3 at %.

Referring to FIG. 11, an amount of etching of silicon carbonitride (SiCN) according to time elapsing is much less than an amount of etching of silicon nitride (SiN) according to time elapsing, and an etch rate of silicon carbonitride (SiCN) is equal to or less than about 9% of an etch rate of silicon nitride (SiN).

Thus, when the upper portion of the second lateral layer 180 is removed by the wet etching process using phosphoric acid, the lower portion of the second lateral layer 180 may not be etched, so as to prevent the generation of void or seam in the second lateral pattern 185 remaining in the lower portion of the second trench 150.

A fourth filling layer 210 may be formed on surfaces of the core, the second lateral pattern 185 and the upper portion of the first lateral layer 170 to fill the second trench 150, a third trench and a fourth trench.

Figure 8:
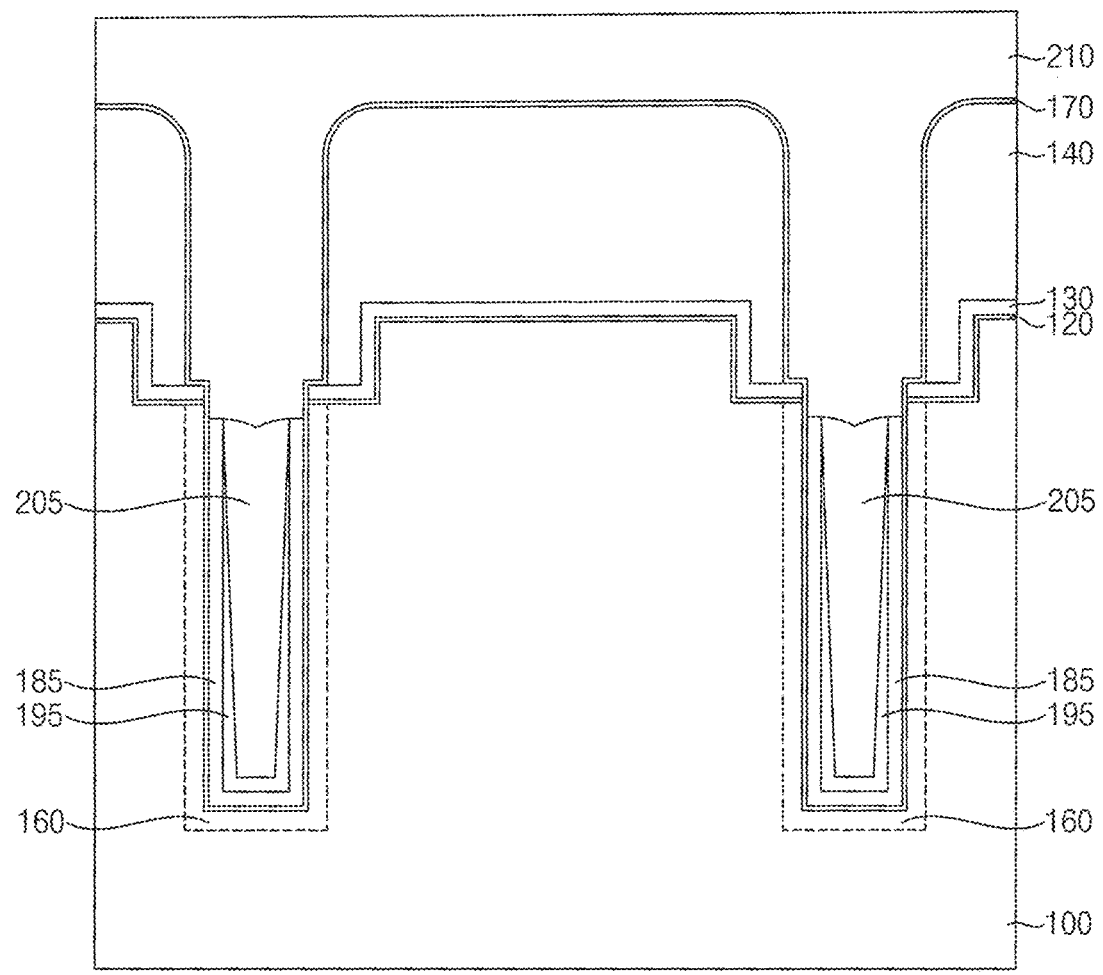

Referring to FIG. 8, a fourth filling layer 210 may be formed on the core, the second lateral pattern 185, and the exposed surface of the upper portion of the first lateral layer 170 to fill the second trench 150.

The fourth filling layer 210 may include an oxide, e.g., silicon oxide.

A thermal treatment process may be performed on the substrate 100 having the above structures thereon.

Referring to FIG. 9, the fourth filling layer 210, the first lateral layer 170 and the first filling layer 140 may be planarized until an upper surface of the second pad layer 130 is exposed.

In some example embodiments, the planarization process may include a chemical mechanical polishing (CMP) process and/or an etch back process.

By the planarization process, the fourth filling layer 210 may be transformed into a fourth filling pattern 215, the first lateral layer 170 may be transformed into a first lateral pattern 175, and the first filling layer 140 may be transformed into a first filling pattern 145. The first and second lateral patterns 175 and 185 may form a first lateral pattern structure.

Referring to FIG. 10, the second pad layer 130 may be partially removed to form a second pad 135, and thus an upper surface of the first pad layer 120 may be partially exposed.

The second pad layer 130 may be removed by, e.g., a wet etching process.

An ion implantation process may be performed to form a light sensing element in the substrate 100, and the exposed portion of the first pad layer 120 may be removed. Thus, the first pad layer 120 may remain as a first pad 125, and an upper surface of the substrate 100 may be exposed.

Hereinafter, the fourth filling pattern 215, and an upper portion of the first lateral pattern 175 on a sidewall of the fourth filling pattern 215, the first filling pattern 145 and the first and second pads 125 and 135 may be referred to as a first filling pattern structure 235. Additionally, the core including the second and third filling patterns 195 and 205 and the first lateral pattern structure including a lower portion of the first lateral pattern 175 and the second lateral pattern 185 may be referred to as a second filling pattern structure 225.

The second filling pattern structure 225 and the first filling pattern structure 235 stacked in the vertical direction may be referred to as a pixel division structure 250.

Referring to FIG. 1 again, the substrate 100 including the pixel division structure 250 may be overturned, and hereinafter, upside and downside of the structures in the substrate 100 including the pixel division structure 250 may be changed with each other.

An upper portion of the substrate 100 may be removed. In some example embodiments, the upper portion of the substrate 100 may be removed by, e.g., a grinding process and/or a polishing process such as CMP process. Thus, an upper portion of the second filling pattern structure 225 included in the pixel division structure 250 may be removed.

That is, upper portions of the core and the first lateral pattern structure included in the second filling pattern structure 225 may be removed, and an upper portion of the first lateral pattern 175 and the second lateral pattern 185 included in the first lateral pattern structure may be exposed. As a result, the pixel division structure 250 may extend through the substrate 100.

The pixel division structure 250 may be formed by the above processes.

As illustrated above, the second lateral layer 180 may include a material having an etch rate lower than that of silicon nitride with respect to phosphoric acid that may be used as an etchant in a wet etching process for removing the upper portion of the second lateral layer 180. Thus, the lower portion of the second lateral layer 180 may not be excessively etched during the wet etching process, so that no void or seam may be formed in the second lateral pattern 185.

Figure 12:
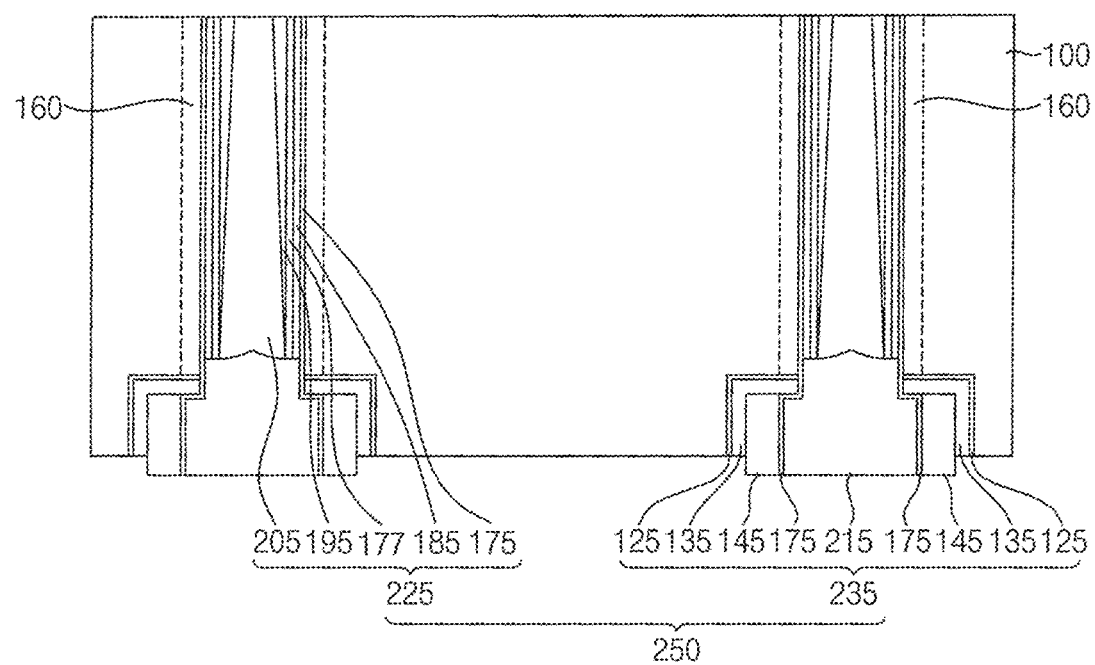
FIG. 12 is a cross-sectional view illustrating a pixel division structure in accordance with some example embodiments.

FIG. 12 is a cross-sectional view illustrating a pixel division structure in accordance with some example embodiments. This pixel division structure may be substantially the same as or similar to that of FIG. 1, except for further including a third lateral pattern 177, and thus repeated explanations thereof are omitted herein.

Referring to FIG. 12, the pixel division structure 250 may include the first and second filling pattern structures 225 and 235, and the second filling pattern structure 225 may include a core including the second and third filling patterns 195 and 205, and a second lateral pattern structure.

In some example embodiments, the second lateral pattern structure may include the upper portion of the first lateral pattern 175, the second lateral pattern 185 and the third lateral pattern 177.

The third lateral pattern 177 may include an oxide, e.g., silicon oxide.

Figure 13:
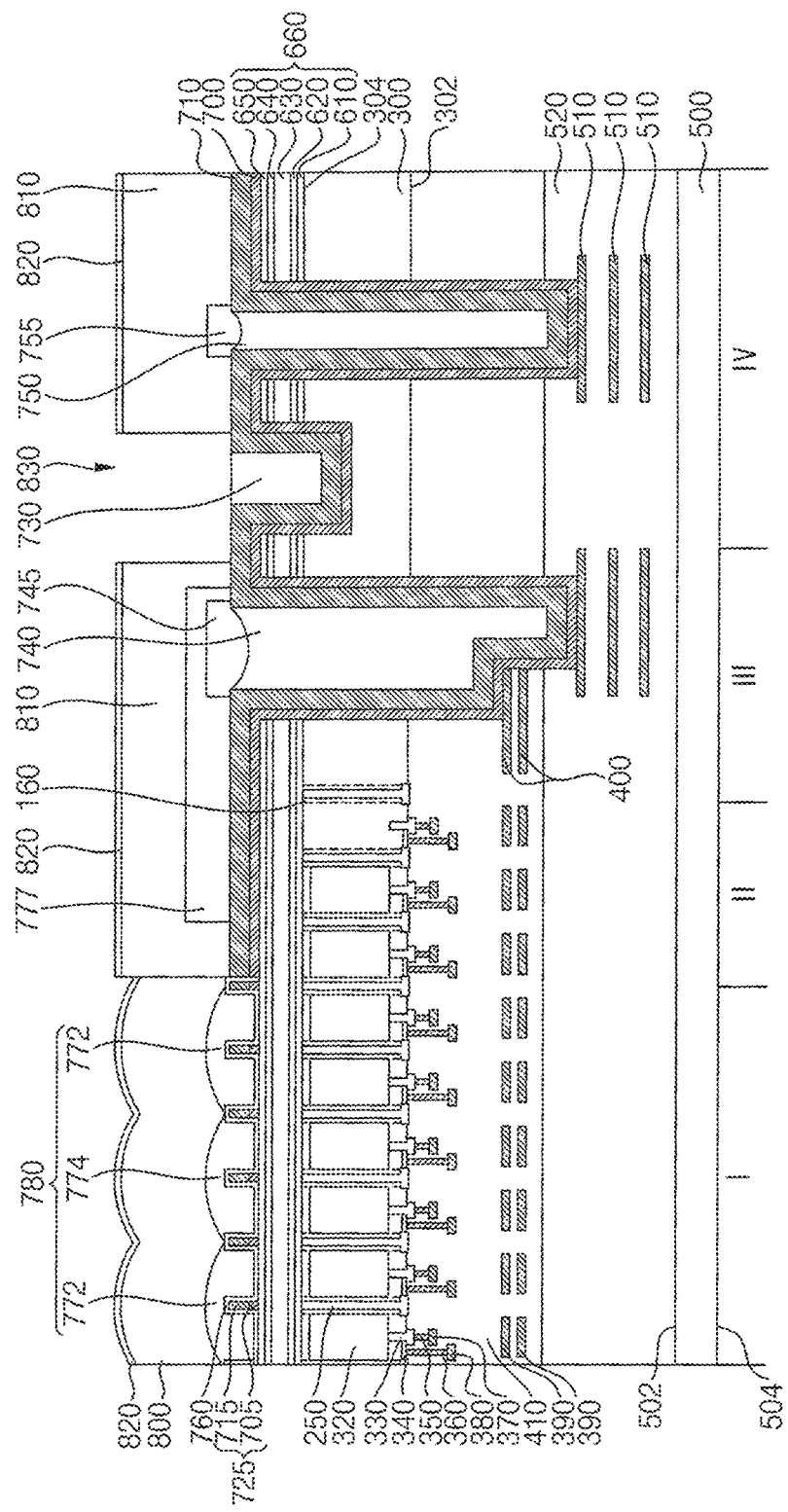
FIG. 13 is a plan view illustrating an image sensor in accordance with example some embodiments.

FIG. 13 is a plan view illustrating an image sensor in accordance with some example embodiments.

This image sensor may include a pixel division structure substantially the same as or similar to the pixel division structure illustrated with reference to FIG. 1, and thus repeated explanations thereof are omitted herein. This image sensor may also include a pixel division structure substantially the same as or similar to the pixel division structure illustrated with reference to FIG. 12.

Referring to FIG. 13, the image sensor may include a second substrate 500, a second insulating interlayer 520, a first insulating interlayer 410, a first substrate 300 and a lower planarization layer 660 sequentially stacked in the vertical direction in first to fourth regions I, II, III and IV. A color filter array layer 780, a microlens 800 and a transparent protection layer 820 may be sequentially stacked on the lower planarization layer 660 in the first region I, and a barrier pattern 700 and a conductive pattern 710 may be sequentially stacked on the lower planarization layer 660 in the second and third regions II and III. A light blocking color filter layer 777 may be formed on the conductive pattern 710, an upper planarization layer 810 may be formed on the conductive pattern 710 to cover the light blocking color filter layer 777, and the transparent protection layer 820 may be formed on the upper planarization layer 810. The upper planarization layer 810 and the transparent protection layer 820 may be sequentially stacked on the lower planarization layer 660 in the fourth region IV.

The image sensor may further include first to third wirings 370, 380 and 390 and first and second vias 350 and 360 contained in the first insulating interlayer 410, the pixel division structure 250 extending through the first substrate 300 in the vertical direction, a light sensing element 320 in each unit pixel region defined by the pixel division structure 250, a transfer gate (TG) 330 extending through a lower portion of the first substrate 300 and having a lower portion protruding from a first surface 302 of the first substrate 300 and covered by the first insulating interlayer 410, and a floating diffusion (FD) region 340 at a lower portion of the first substrate 300 adjacent to the TG 330 in the first and second regions I and II.

The image sensor may further include an interference blocking structure 725 between color filters 772 and 774 included in the color filter array layer 780 and a protection layer 760 covering a surface of the interference blocking structure 725 on the lower planarization layer 660 in the first region I.

The image sensor may further include a fourth wiring 400 contained in the first insulating interlayer 410, a fifth wiring 510 contained in the second insulating interlayer 520, and a first through via structure extending through the lower planarization layer 660, the first substrate 300, the first insulating interlayer 410 and an upper portion of the second insulating interlayer 520 to commonly contact the fourth and fifth wirings 400 and 510 in the third region III.

The image sensor may further include the fifth wiring 510 contained in the second insulating interlayer 520, a conductive pad 730 extending through the lower planarization layer 660 and an upper portion of the first substrate 300, and a second through via structure extending through the lower planarization layer 660, the first substrate 300, the first insulating interlayer 410 and an upper portion of the second insulating interlayer 520 to contact the fifth wiring 510.

The image sensor may further include various transistors at lower portions of the first substrate 300 adjacent to the first surface 302 of the first substrate 300. The transistors may include, e.g., source follower transistors, reset transistors and select transistors. The TG 330 and the FD region 340 may form a transfer transistor. That is, the light sensing element 320 may serve as a source region of the transfer transistor, and the FD region 340 may serve as a drain region of the transfer transistor.

In some example embodiments, in a plan view, the first region I may have a shape of a square or rectangle, the second region II may surround the first region I, the third region III may surround the second region II, and the fourth region IV may surround the third region III, however, example embodiments are not limited thereto.

In some example embodiments, the first region I may be an active pixel region in which active pixels are formed, the second region II may be an OB pixel region in which OB pixels are formed, the third region III may be a stack region in which the first through via structure is formed, and the fourth region IV may be a pad region in which the conductive pads 730 are formed.

The first substrate 300 may include the first surface 302 and a second surface 304 opposite to the first surface 302, and the second substrate 500 may include a third surface 502 and a fourth surface 504 opposite to the third surface 502. FIG. 13 shows that the first surface 302 is disposed under the second surface 304, and the third surface 502 is disposed over the fourth surface 504.

In some example embodiments, p-type impurities may be doped into a portion or an entire portion of the first substrate 300 to form a p-type well.

The pixel division structure 250 may extend in the vertical direction in the first and second regions I and II, and may have a lattice pattern in a plan view. A plurality of unit pixel regions defined by the pixel division structure 250 may be arranged in the horizontal direction. The pixel division structure 250 may be substantially the same as or similar to that of FIG. 1 or FIG. 12.

In some example embodiments, the light sensing element 320 may be a portion of a photodiode (PD). The light sensing element 320 may be an impurity region doped with n-type impurities in the p-well in the first and second regions I and II of the first substrate 300, and thus the light sensing element 320 and the p-well may form a PN junction diode.

The light sensing element 320 may be formed in each of the unit pixel regions defined by the pixel division structure 250 in the first and second regions I and II, however, may not be formed in some of the unit pixel regions in the second region II.

The TG 330 may include a buried portion extending from the first surface 302 of the first substrate 300 in the vertical direction upwardly and a protrusion portion under the buried portion and having a bottom surface lower than the first surface 302 of the first substrate 300.

The FD region 340 may be formed at a portion of the first substrate 300 adjacent to the first surface 302 and the TG 330, and may be doped with n-type impurities.

The first via 350 may contact the TG 330, and may be connected to the first wiring 370. The second via 360 may contact the FD region 340, and may be connected to the second wiring 380.

Vias and wirings that may be connected to the various transistors, that is, the source follower transistors, the reset transistor and the select transistors may be further formed in the first insulating interlayer 410 in the first and second regions I and II. FIG. 13 shows that the third and fourth wirings 390 and 400 are formed at two levels in the vertical direction, however, example embodiments are not limited thereto.

Each of the first and second insulating interlayers 410 and 520 may include an oxide, e.g., silicon oxide or a low-k dielectric material.

The lower planarization layer 660 may include first, second, third, fourth and fifth layers 610, 620, 630, 640 and 650 sequentially stacked in the vertical direction. For example, the first to fifth layers 610, 620, 630, 640 and 650 may include aluminum oxide, hafnium oxide, silicon oxide, silicon nitride and hafnium oxide, respectively, but example embodiments are not limited thereto.

The interference blocking structure 725 may be formed on the lower planarization layer 660 to overlap the pixel division structure 250 in the vertical direction, and may have a lattice pattern in a plan view. In some example embodiments, the interference blocking structure 725 may include first and second interference blocking patterns 705 and 715 stacked in the vertical direction. The first interference blocking pattern 705 may include a metal nitride, and the second interference blocking pattern 715 may include a metal. Alternatively, the second interference blocking pattern 715 may include low refractive index material (LRIM).

The protection layer 760 may include a metal oxide, e.g., aluminum oxide.

The color filter array layer 780 may be formed on the protection layer 760, and sidewalls and bottom surfaces of the first color filter 772, the second color filter 774 and the third color filter included in the color filter array layer 780 may be covered by the protection layer 760. The first color filter 772, the second color filter 774 and the third color filter may be a green color filter G, a blue color filter B and a red color filter R, respectively, but example embodiments are not limited thereto.

In some example embodiments, the light blocking color filter layer 777 may include the same or substantially the same composition as the second color filter 774, which may absorb a light having a relatively large wavelength among the first color filter 772, the second color filter 774 and the third color filter included in the color filter array layer 780.

The light blocking color filter layer 777 may be formed on the lower planarization layer 660 and the first through via structure in the second and third regions II and III, and may be spaced apart by a desired (or, alternatively given distance in the horizontal direction from the first region I.

The first through via structure may include a fifth filling pattern 740 extending in the vertical direction through the lower planarization layer 660, the first substrate 300, the first insulating interlayer 410 and an upper portion of the second insulating interlayer 520, a conductive pattern 710 covering a lower surface and a sidewall of the fifth filling pattern 740, a barrier pattern 700 covering a lower surface and a sidewall of the conductive pattern 710, and a first capping pattern 745 on an upper surface of the fifth filling pattern 740.

The second through via structure may include a sixth filling pattern 750 extending in the vertical direction through the lower planarization layer 660, the first substrate 300, the first insulating interlayer 410 and an upper portion of the second insulating interlayer 520, the conductive pattern 710 covering a lower surface and a sidewall of the sixth filling pattern 750, the barrier pattern 700 covering the lower surface and the sidewall of the conductive pattern 710, and a second capping pattern 755 on an upper surface of the sixth filling pattern 750.

Each of the fifth and sixth filling patterns 740 and 750 may include, e.g., a LRIM, and each of the first and second capping patterns 745 and 755 may include, e.g., a photoresist material.

A portion of the conductive pattern 710 included in the first through via structure may commonly contact the fourth and fifth wirings 400 and 510 so that the fourth and fifth wirings 400 and 510 may be electrically connected with each other, and a portion of the conductive pattern 710 included in the second through via structure may contact the fifth wiring 510 so as to be electrically connected thereto.

The conductive pattern 710 may be included in the first and second through via structures, and may also be formed on the lower planarization layer 660 in the second to fourth regions II, III and IV. A portion of the conductive pattern 710 in the second and third regions II and III may be referred to as a light blocking metal pattern.

The conductive pattern 710 may include a metal, e.g., tungsten, and the barrier pattern 700 may include a metal nitride, e.g., titanium nitride.

The conductive pad 730 may be electrically connected with an outer wiring, and may be a path through which electrical signals may be input into the active pixels and/or the OB pixels, or electrical signals may be output from the active pixels and/or the OB pixels. The conductive pad 730 may include a metal, e.g., aluminum. A lower surface and a sidewall of the conductive pad 730 may be covered by the conductive pattern 710.

The microlens 800 may be formed on the color filter array layer 780 and the protection layer 760 in the first region I, and the upper planarization layer 810 may be formed on the light blocking color filter layer 777 and the second through via structure in the second to fourth regions II, III and IV, however, the upper planarization layer 810 may include a third opening 830 exposing an upper surface of the conductive pad 730 in the fourth region IV. In some example embodiments, the microlens 800 and the upper planarization layer 810 may include substantially the same material, e.g., a photoresist material having a high transmittance.

The transparent protection layer 820 may be formed on the microlens 800 and the upper planarization layer 810. The transparent protection layer 820 may include, e.g., SiO, SiOC, SiC, SiCN, etc., but example embodiments are not limited thereto.

Figure 14:
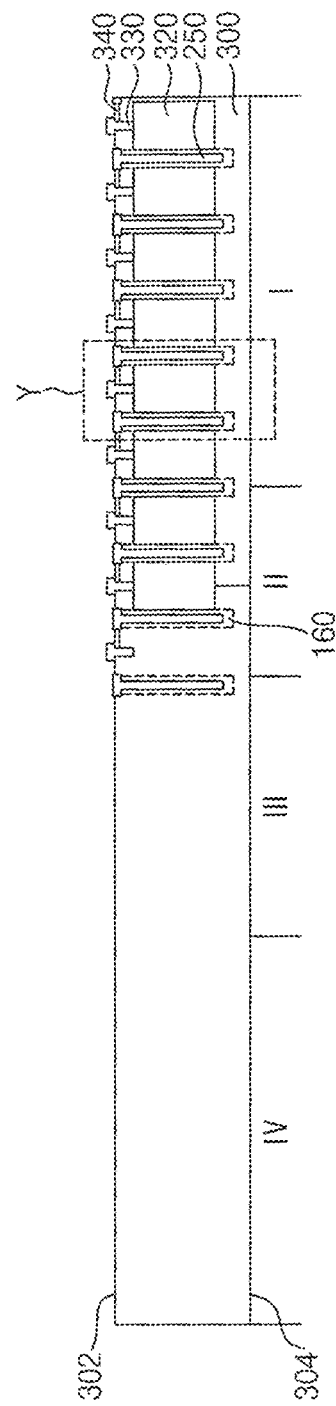
FIGS. 14, 15, 16, 17, 18, 19, 20 and 21 are cross-sectional views illustrating a method of manufacturing an image sensor in accordance with some example embodiments.
Figure 15:
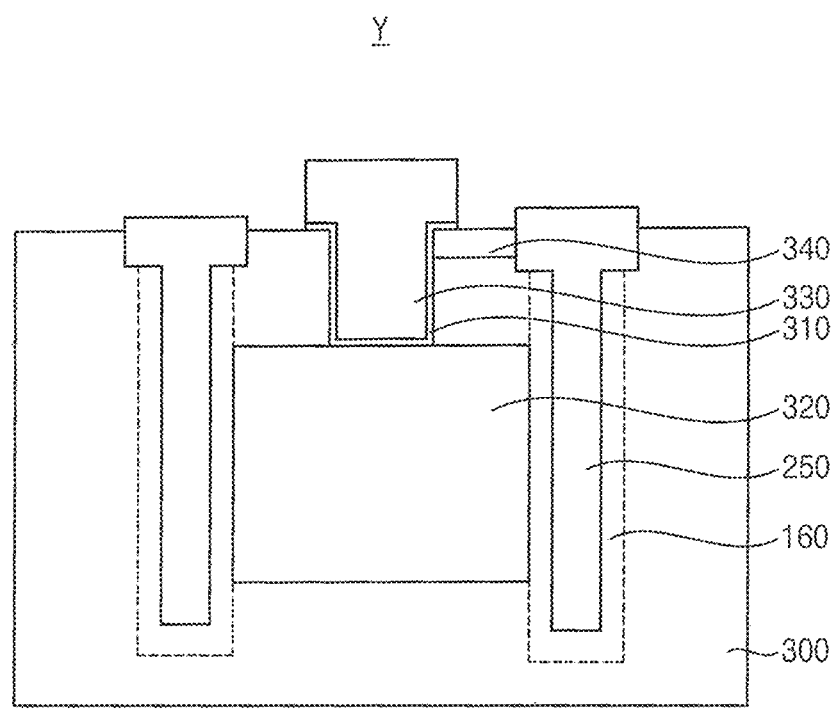

The image sensor may include the pixel division structure 250 illustrated with reference to FIG. 1 or FIG. 2, and thus no void or seam may be formed in the second lateral pattern 185 included in the pixel division structure 250 so decrease the dark current FIGS. 14 to 21 are cross-sectional views illustrating a method of manufacturing an image sensor in accordance with some example embodiments. FIG. 15 is an enlarged cross-sectional view of a region Y of FIG. 14. This method may include processes substantially the same as or similar to processes for forming the pixel division structure illustrated with reference to FIGS. 1 to 11, and thus repeated explanations thereof are omitted herein.

Referring to FIGS. 14 and 15, the pixel division structure 250, an impurity region 160 and a light sensing element 320 may be formed in a first substrate 300 including first to fourth regions I, II, III and IV, and a TG 330 and a FD region 340 may be formed.

In some example embodiments, p-type impurities, e.g., boron may be doped into a portion or an entire portion of the first substrate 300 to form a p-well.

The pixel division structure 250 and the impurity region 160 may be formed by processes substantially the same as or similar to those illustrated with reference to FIGS. 1 to 10. Thus, the pixel division structure 250 may be formed to extend from the first surface 302 in the vertical direction downwardly in the first and second regions I and II of the first substrate 300, and the impurity region 160 including p-type impurities, e.g., boron may be formed at a portion of the first substrate 300 adjacent to the pixel division structure 250. An impurity concentration of the impurity region 160 may be higher than an impurity concentration of the p-well.

In some example embodiments, the light sensing element 320 may be a portion of a PD. Thus, the light sensing element 320 may be formed by doping n-type impurities, e.g., phosphorus into the p-well in the first and second regions I and II of the first substrate 300.

In some example embodiments, the pixel division structure 250 may be formed after forming the light sensing element 320.

The TG 330 may be formed by forming a third trench extending in the vertical direction from the first surface 302 of the first substrate 300 downwardly, and filling the third trench and protruding from the trench upwardly using a conductive material.

The FD region 340 may be formed by doping n-type impurities, e.g., boron into a portion of the first substrate 300 adjacent to the first surface 302 and the TG 330.

Figure 16:
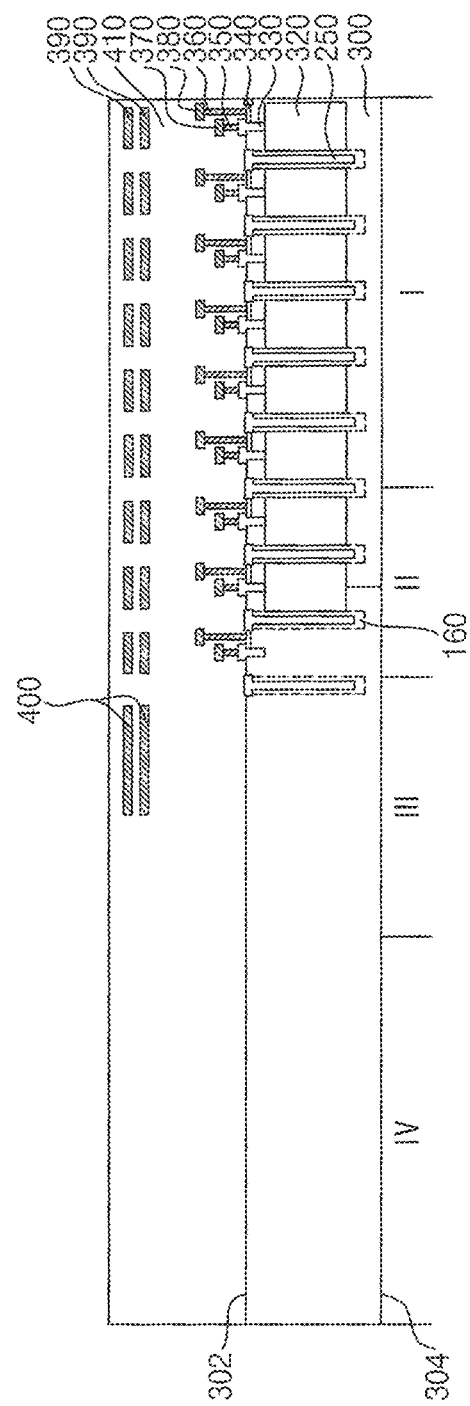

Referring to FIG. 16, a first insulating interlayer 410 containing first and second vias 350 and 360 and first to fourth wirings 370, 380, 390 and 400 may be formed on the first surface 302 of the first substrate 300.

In some example embodiments, the first and second vias 350 and 360 and the first to fourth wirings 370, 380, 390 and 400 may be formed by a dual damascene process or a single damascene process.

Figure 17:
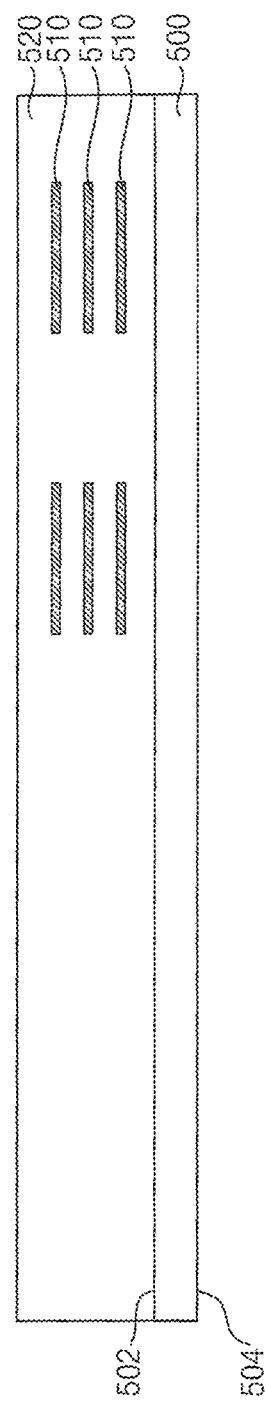

Referring to FIG. 17, a second insulating interlayer 520 containing a fifth wiring 510 and third vias connected to the fifth wiring 510 may be formed on a third surface 502 of a second substrate 500 including the third surface 502 and a fourth surface 504.

FIG. 17 shows the fifth wiring 510 is formed at third levels in the vertical direction, however, example embodiments are not limited thereto. In some example embodiments, the fifth wirings 510 and the third vias may be formed by a dual damascene process or a single damascene process.

Figure 18:
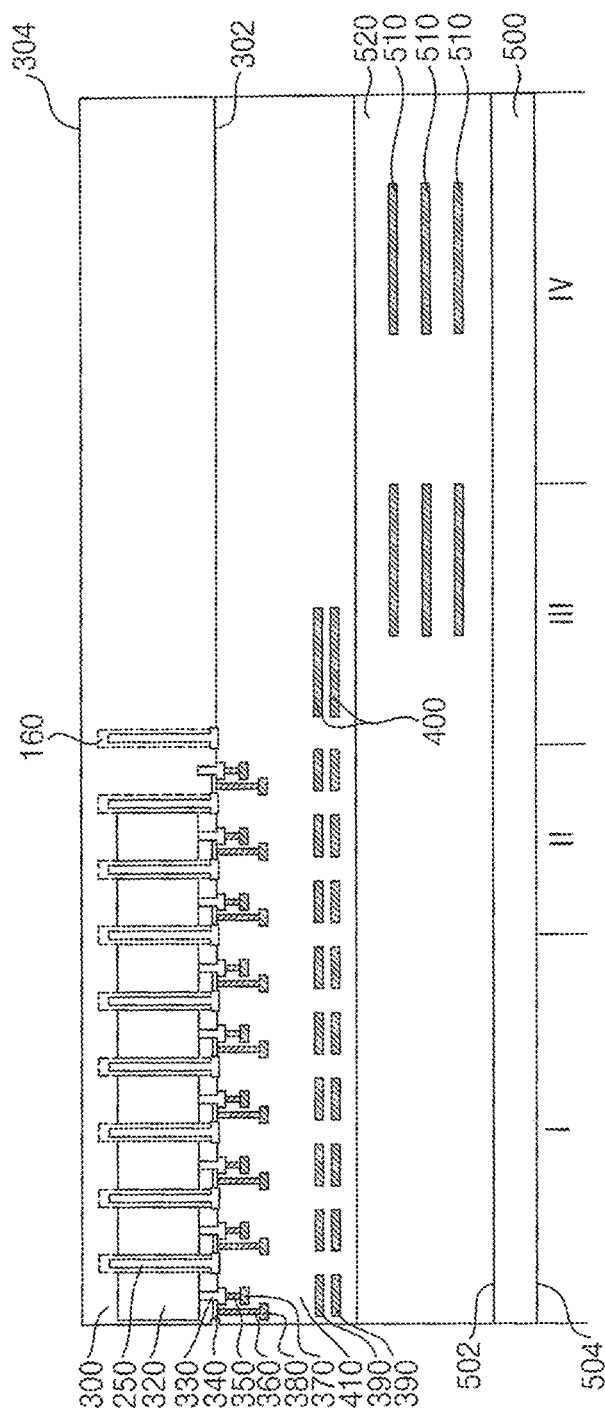

Referring to FIG. 18, the first insulating interlayer 410 on the first substrate 300 and the second insulating interlayer 520 on the second substrate 500 may be bonded with each other.

In some example embodiments, the first and second insulating interlayers 410 and 520 may be bonded with each other through a bonding layer. Alternatively, the first and second insulating interlayers 410 and 520 may be directly bonded with each other. After bonding the first and second insulating interlayers 410 and 520, the bonded structure may be overturned so that the second surface 304 of the first substrate 300 may face upwardly.

As the first and second substrates 300 and 500 are bonded with each other, the fifth wirings 510 on the second substrate 500 may be disposed in the third and fourth regions III and IV.

Figure 19:
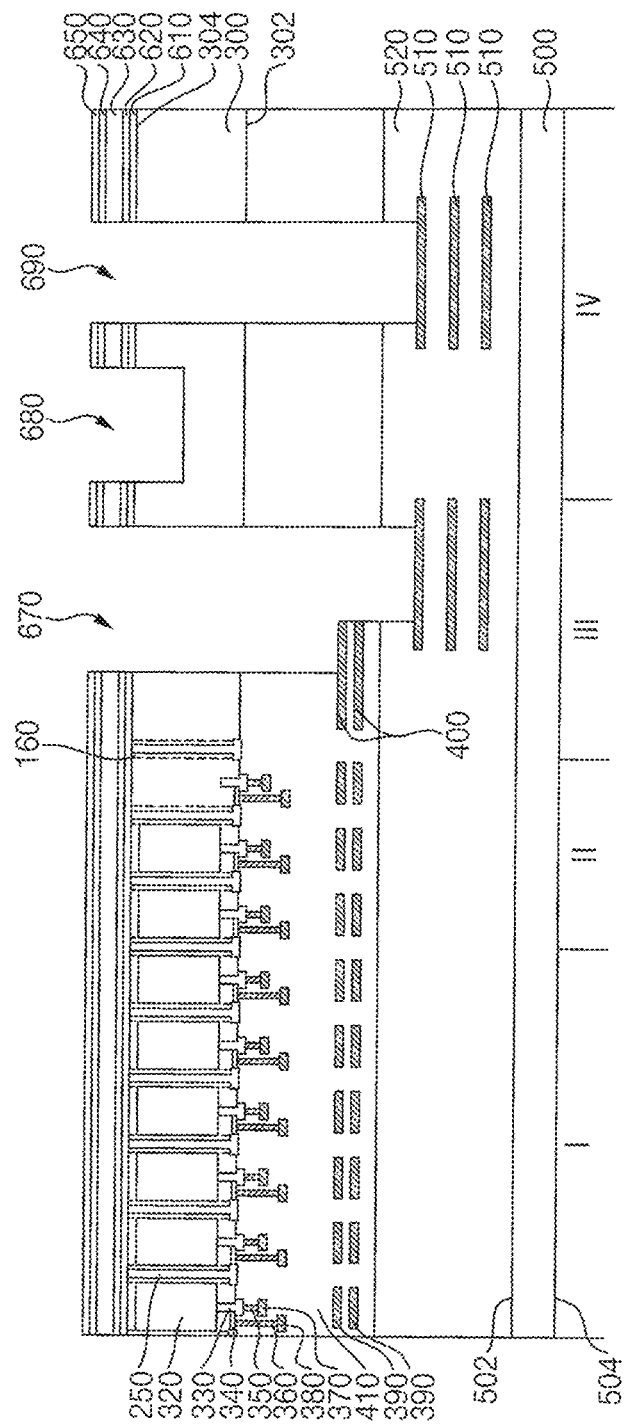

Referring to FIG. 19, a portion of the first substrate 300 adjacent to the second surface 304 may be removed.

In some example embodiments, the portion of the first substrate 300 adjacent to the second surface 304 may be removed by a polishing process, e.g., a grinding process, a CMP process, etc. Thus, the second filling pattern structure 225 included in the pixel division structure 250 may be partially removed, and the pixel division structure 250 may extend through the first substrate 300.

That is, the upper portions of the core and the first lateral pattern structure included in the second filling pattern structure 225 may be removed, and the upper portion of the first lateral pattern 175 and the second lateral pattern 185 included in the first lateral pattern structure may be exposed.

A lower planarization layer 660 may be formed on the second surface 304 of the first substrate 300.

In an example embodiment, the lower planarization layer 660 may include first to fifth layers 610, 620, 630, 640 and 650 sequentially stacked in the vertical direction.

The lower planarization layer 660, the first substrate 300, the first insulating interlayer 410 and an upper portion of the second insulating interlayer 520 in the third region III may be partially removed to form a first opening 670, the lower planarization layer 660 and an upper portion of the first substrate 300 in the fourth region IV may be removed to form a fourth trench 680, and the lower planarization layer 660, the first insulating interlayer 410 and an upper portion of the second insulating interlayer 520 in the fourth region IV may be removed to form a second opening 690.

The first opening 670 may expose the fourth wiring 400 in the first insulating interlayer 410 and the fifth wiring 510 in the second insulating interlayer 520, and the second opening 690 may expose the fifth wiring 510 in the second insulating interlayer 520.

Figure 20:
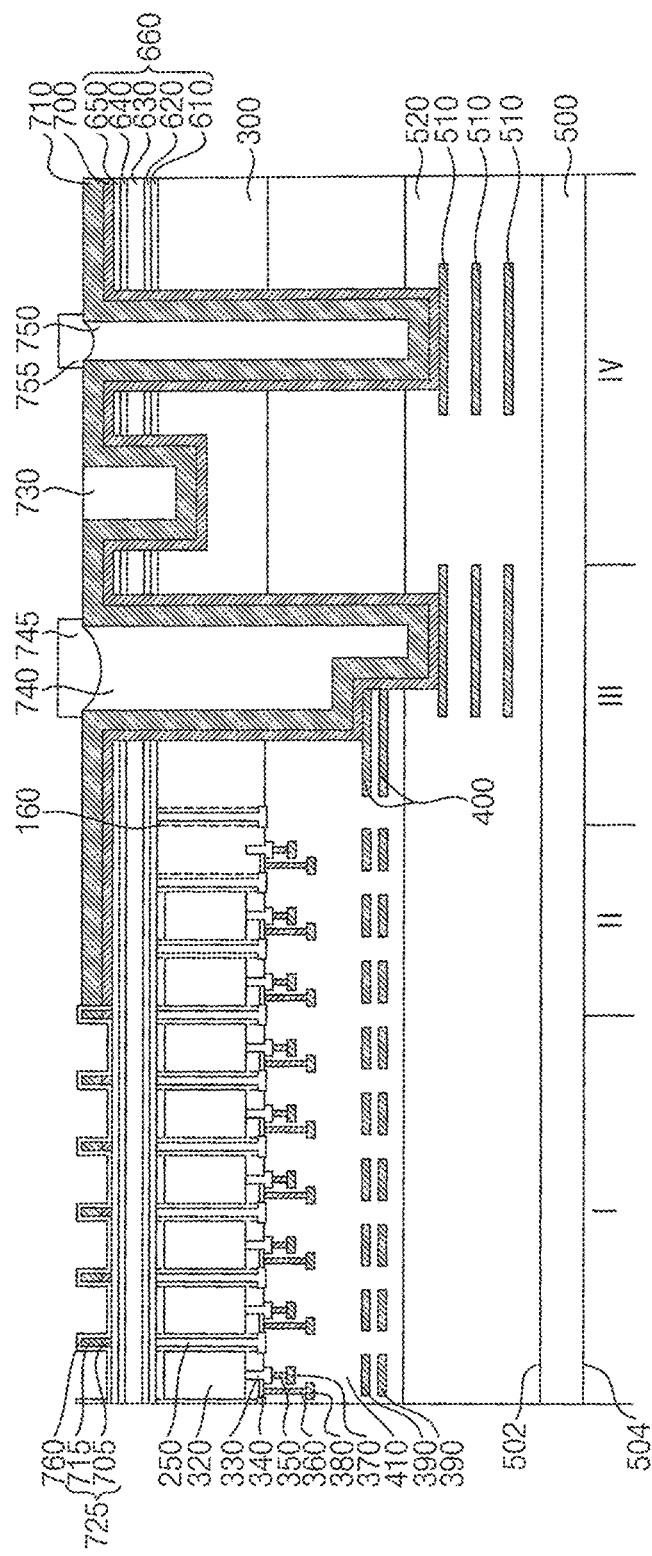

Referring to FIG. 20, a barrier layer and a first conductive layer may be sequentially formed on bottoms and sides of the first and second openings 670 and 690 and the fourth trench 680 and an upper surface of the lower planarization layer 660, a second conductive layer may be formed on the first conductive layer to fill the fourth trench 680, and an upper portion of the second conductive layer may be exposed until an upper surface of the first conductive layer is exposed.

Thus, a conductive pad 730 may be formed on the first conductive layer in the fourth trench 680 in the fourth region IV.

The planarization process may be performed by, e.g., a chemical mechanical polishing (CMP) process and/or an etch back process.

A fifth filling layer may be formed on the first conductive layer and the conductive pad 730 to fill the first and second openings 670 and 690, and an upper portion of the fifth filling layer may be planarized until an upper surface of the first conductive layer is exposed.

An additional etching process may be performed on the fifth filling layer so that a fifth filling pattern 740 may be formed on the first conductive layer in the first opening 670 in the third region III, and a sixth filling pattern 750 may be formed on the first conductive layer in the second opening 690 in the fourth region IV.

A capping layer may be formed on the fifth and sixth filling patterns 740 and 750 and the conductive pad 730 and patterned to form first and second capping patterns 745 and 755 on the fifth and sixth filling patterns 740 and 750, respectively.

Portions of the barrier layer and the first conductive layer in the first region I may be patterned to form a first interference blocking pattern 705 and a second interference blocking pattern 715, respectively, and portions of the barrier layer and the first conductive layer in the second region II may remain as a barrier pattern 700 and a conductive pattern 710, respectively. The first and second interference blocking patterns 705 and 715 may form an interference blocking structure 725.

An upper surface of the lower planarization layer 660 in the first region I may be partially exposed.

Portions of the barrier pattern 700, the conductive pattern 710, the fifth filling pattern 740 and the first capping pattern 745 in the first opening 670 in the third region III may form a first through via structure, and portions of the barrier pattern 700, the conductive pattern 710, the sixth filling pattern 750 and the second capping pattern 755 in the second opening 690 in the fourth region IV may form a second through via structure.

A protection layer 760 may be formed on the lower planarization layer 660 and the interference blocking structure 725 in the first region I.

Figure 21:
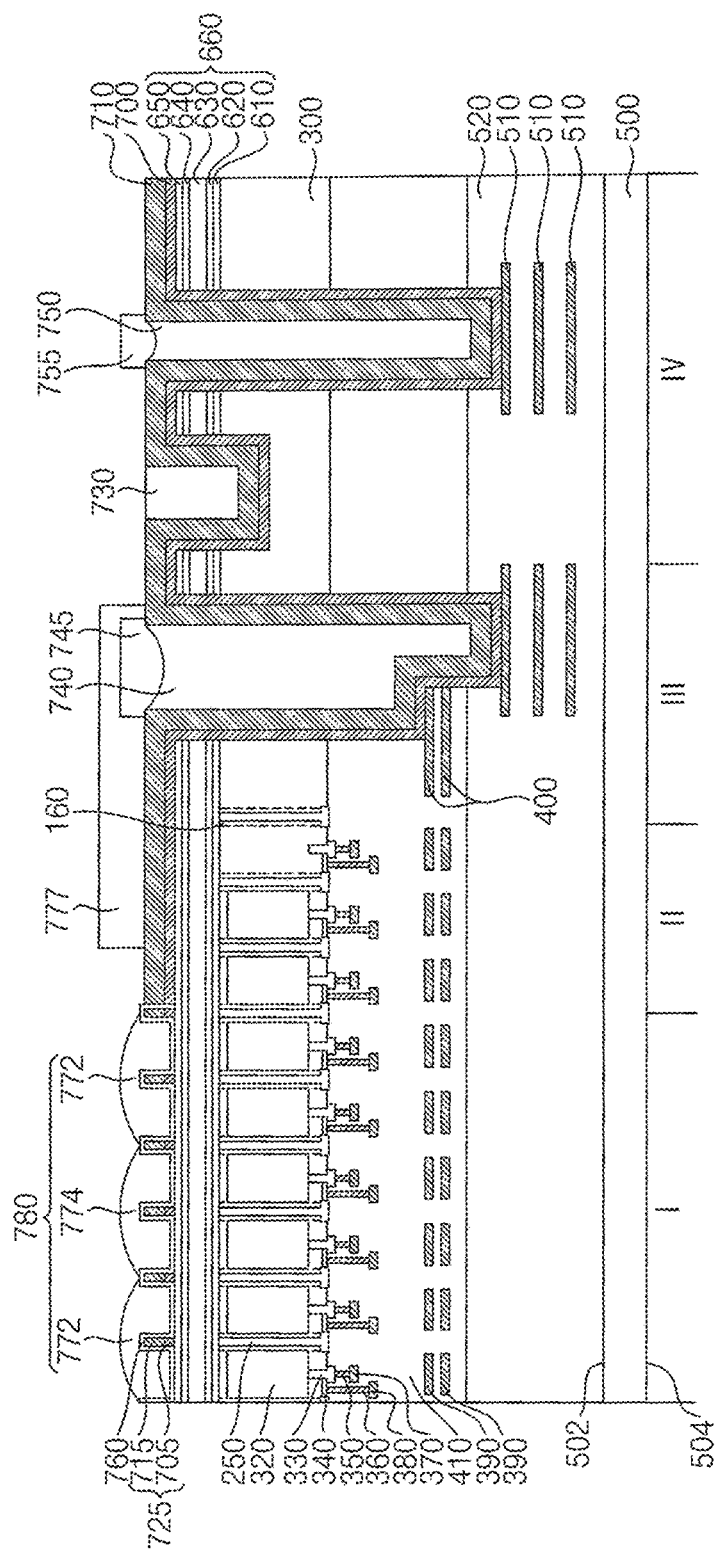

Referring to FIG. 21, a color filter array layer 780 including a first color filter 772, a second color filter 774 and a third color filter may be formed on the protection layer 760 in the first region I, and a light blocking color filter layer 777 may be formed on the conductive pattern 710 and the first through via structure in the second and third regions II and III.

In some example embodiments, each of the first color filter 772, the second color filter 774 and the third color filter may be formed by depositing a color filter layer on the protection layer 760, the conductive pattern 710, the first and second capping patterns 745 and 755 and the conductive pad 730, e.g., through a spin coating process, and performing an exposure process and a developing process on the color filter layer.

The light blocking color filter layer 777 may be formed together with some of the color filters included in the color filter array layer 780, e.g., the second color filter 774.

In some example embodiments, the first color filter 772, the second color filter 774 and the third color filter may be a green filter G, a blue filter B and a red filter R, respectively. However, example embodiments are not limited thereto.

Referring to FIG. 13 again, an upper planarization layer 810 may be formed on the color filter array layer 780, the protection layer 760, the light blocking color filter layer 777, the conductive pad 730 and the second capping pattern 755 in the first to fourth regions I, II, III and IV, and a patterning process and a reflow process may be performed on the upper planarization layer 810 in the first region I to form a microlens 800.

A transparent protection layer 820 may be formed on the microlens 800 and the upper planarization layer 810, and a portion of the transparent protection layer 820 overlapping the conductive pad 730 in the vertical direction in the fourth region IV and a portion of the upper planarization layer 810 thereunder may be removed to form a third opening 830 exposing an upper surface of the conductive pad 730.

An upper wiring (not shown) may be further formed to be electrically connected to the conductive pad 730 to complete the fabrication of the image sensor.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

As described above, although the present inventive concepts have been described with reference to some example embodiments, many modifications are possible in the example embodiments without materially departing from novel teachings and advantages of the present inventive concepts.

What is claimed is:

1. An image sensor comprising:
a pixel division structure including a core and a lateral pattern structure on a sidewall of the core, the pixel division structure extending through a substrate in a vertical direction, the vertical direction perpendicular to an upper surface of the substrate, the pixel division structure defining unit pixel regions, and the unit pixel regions including unit pixels;
a light sensing element in each of the unit pixel regions;
a color filter array layer on the substrate, the color filter array layer including color filters; and
a microlens on the color filter array layer, wherein
the core includes a first filling pattern and a second filling pattern inside the first filling pattern,
each of the first and second filling patterns includes a semiconductor material,
the first filling pattern includes a first material and the second filling pattern includes a second material different from the first material,
the lateral pattern structure includes a second lateral pattern on the sidewall of the core, and a first lateral pattern on an outer sidewall of the second lateral pattern, the first lateral pattern includes silicon oxide, and the second lateral pattern includes silicon nitride containing carbon.

2. The image sensor of claim 1, wherein the second lateral pattern includes silicon carbonitride (SiCN), silicon oxycarbonitride (SiOCN), or silicon borocarbonitride (SiBCN).

3. The image sensor of claim 2, wherein the carbon included in the second lateral pattern has an atomic percentage in a range of 1 at % to 20 at %.

4. The image sensor of claim 1, wherein the lateral pattern structure further includes a third lateral pattern between the sidewall of the core and the second lateral pattern.

5. The image sensor of claim 4, wherein the third lateral pattern includes silicon oxide.

6. The image sensor of claim 1, wherein the first filling pattern includes polysilicon doped with n-type impurities or p-type impurities; and a sidewall of the second filling pattern is surrounded by the first filling pattern, and the second filling pattern includes polysilicon.

7. The image sensor of claim 6, wherein a width of the first filling pattern increases from a top of the first filling pattern towards a bottom of the first filling pattern.

8. The image sensor of claim 1, wherein the core and the lateral pattern structure define a first filling pattern structure, and the pixel division structure further includes a second filling pattern structure under the first filling pattern structure.

9. The image sensor of claim 8, wherein a width of the second filling pattern structure is greater than a width of the first filling pattern structure.

10. An image sensor comprising:

a pixel division structure extending through a substrate in a vertical direction, the vertical direction substantially perpendicular to an upper surface of the substrate, the pixel division structure including a core extending in the vertical direction and a lateral pattern structure on a sidewall of the core, the pixel division structure defining unit pixel regions, the unit pixel regions including unit pixels;

a light sensing element in each of the unit pixel regions;

a color filter array layer on the substrate, the color filter array layer including color filters; and a microlens on the color filter array layer, wherein the lateral pattern structure includes a second lateral pattern on the sidewall of the core, and a first lateral pattern on an outer sidewall of the second lateral pattern, the core includes a first filling pattern and a second filling pattern inside the first filling pattern, each of the first and second filling patterns includes a semiconductor material, the first filling pattern includes a first material and the second filling pattern includes a second material different from the first material, the first filling pattern includes polysilicon doped with p-type or n-type impurities, the first lateral pattern includes silicon oxide, and the second lateral pattern includes silicon carbonitride (SiCN), silicon oxycarbonitride (SiOCN), or silicon borocarbonitride (SiBCN).

11. The image sensor of claim 10, wherein carbon included in the second lateral pattern has an atomic percentage in range of 1 at % to 20 at %.

12. The image sensor of claim 10, wherein the core and the lateral pattern structure define a first filling pattern structure, and the pixel division structure further includes a second filling pattern structure under the first filling pattern structure.

13. The image sensor of claim 10, wherein the lateral pattern structure further includes a third lateral pattern between the sidewall of the core and the second lateral pattern.

14. The image sensor of claim 13, wherein the third lateral pattern includes silicon oxide.

15. The image sensor of claim 10, wherein a sidewall of the second filling pattern is surrounded by the first filling pattern, and the second filling pattern includes polysilicon.

16. The image sensor of claim 15, wherein a width of the first filling pattern increases from a top of the first filling pattern towards a bottom of the first filling pattern.

17. An image sensor comprising:

a first substrate defining a first region, a second region, a third region and a fourth region inside the first substrate and a space under and over the first substrate, the second region surrounding the first region, the third region surrounding the second region, and the fourth region surrounding the third region;

a first insulating interlayer on the first substrate, the first insulating interlayer containing first wirings in the third region;

a second insulating interlayer on the first insulating interlayer, the second insulating interlayer containing second wirings in the third region;

a second substrate on the second insulating interlayer;

a pixel division structure in the second substrate in the first and second regions, the pixel division structure including a core and a lateral pattern structure on a sidewall of the core, the pixel division structure defining unit pixel regions, the unit pixel regions including unit pixels;

a light sensing element in each of the unit pixel regions of the second substrate;

a transfer gate (TG) extending through a lower portion of the second substrate, the TG contacting the light sensing element;

a floating diffusion (FD) region at the lower portion of the second substrate adjacent to the TG;

a color filter array layer on the second substrate, the color filter array layer including color filters;

an interference blocking structure between the color filters; and a microlens on the color filter array layer, wherein the lateral pattern structure includes a second lateral pattern on the sidewall of the core, and a first lateral pattern on an outer sidewall of the second lateral pattern, wherein the first lateral pattern includes silicon oxide, and the second lateral pattern includes silicon nitride containing carbon.

18. The image sensor of claim 17, wherein the second lateral pattern includes silicon carbonitride (SiCN), silicon oxycarbonitride (SiOCN), or silicon borocarbonitride (SiBCN).

19. The image sensor of claim 17, wherein
the first region is an active pixel region including active pixels,
the second region is an optical black (OB) pixel region including OB pixels,
the third region is a stack region including a through via structure, and
the fourth region is a pad region including a pad.

20. The image sensor of claim 19, further comprising:
a light blocking metal pattern on the second substrate in the second region;
the through via structure extending through the second substrate, the second insulating interlayer, and an upper portion of the first insulating interlayer to commonly contact the first and second wirings in the third region; and
the pad extending through an upper portion of the second substrate in the fourth region.

\* \* \* \* \*